United States Patent [19]

Gursky

[11] 4,234,666
[45] Nov. 18, 1980

[54] CARRIER TAPES FOR SEMICONDUCTOR DEVICES

[75] Inventor: Michael T. Gursky, Allentown, Pa.

[73] Assignee: Western Electric Company, Inc., New York, N.Y.

[21] Appl. No.: 928,134

[22] Filed: Jul. 26, 1978

[51] Int. Cl.² .................. H02G 13/08; H05K 5/00; H05K 15/00
[52] U.S. Cl. ............... 428/573; 174/52 FP; 357/69; 357/70; 361/421
[58] Field of Search .......... 428/573; 174/52 FP; 357/69, 70; 361/421

[56] References Cited

U.S. PATENT DOCUMENTS

| | | | |
|---|---|---|---|
| 3,258,661 | 6/1966 | Mierendorf et al. | 357/80 |
| 3,947,867 | 3/1976 | Duffek et al. | 357/70 |
| 3,978,516 | 8/1976 | Noe | 174/52 FP |
| 4,003,073 | 1/1977 | Helda | 357/70 |
| 4,026,008 | 5/1977 | Drees et al. | 29/574 |
| 4,048,438 | 9/1977 | Zimmerman | 175/52 FP |
| 4,109,096 | 8/1978 | Dehaine | 174/68.5 |

OTHER PUBLICATIONS

Lyman, "Electronics" Special report: film carriers star in high vol. 1C production 12-25-75.

Primary Examiner—Brooks H. Hunt
Attorney, Agent, or Firm—D. C. Watson; R. D. Lott

[57] ABSTRACT

A carrier tape (20) is provided for assembling components to make semiconductor devices. The tape (20) is made from soft, copper foil (21). Patterns (27) containing clusters (24) of inner leads (28) and (30) are accurately formed into tape (20) for bonding to chips (52).

Tape (20) is indexed for bonding the free ends (36) of inner leads (28) and (30) to pads (54) of chip (52). Then tape (20) is indexed for bonding fixed ends (34) of leads (28) and (30) to stiff outer leads (86).

Leads (28) and (30) in cluster (24) are deformed into a precise bell-like shape called a "bug" with chip (52) riding horizontally on top of the bell. Bugging develops flexural and tensile stresses and bonding causes thermal stresses in leads (28) and (30). Such stresses can shift or twist bug (51); warp the structural margin (26) and holes (22) of tape (20), and they can distort adjacent lead clusters (24) on tape (20).

One or more stress relief sites (39) are provided in leads (28) and (30) to uniformly control such stresses. Sites (39) advantageously prevent stresses from being transmitted outside cluster (24). Also sites (39) aid in deformation of leads (28) and (30) to form bug (51).

The stress relief sites (39) permit a high density of lead clusters (24) per linear foot of web (21). Costly plastic substrates (12) are eliminated; and the likelihood of short circuiting in the assembled devices is reduced.

9 Claims, 11 Drawing Figures

CARRIER TAPES FOR SEMICONDUCTOR DEVICES

BACKGROUND OF THE INVENTION

1. Field of the Invention

This invention relates to carrier tapes for semiconductor devices. More particularly, this invention relates to patterns of lead clusters in carrier tapes and methods of bonding chips to lead clusters. The invention further relates to certain deformations of the leads in the clusters so that each chip, after it is bonded to the leads, maintains a given posture in the assembled device. Also, the invention relates to certain flexural and tensile stresses developed in each lead during deformation and the control of such stresses.

2. Prior Art

AUTOMATION IN THE SEMICONDUCTOR INDUSTRY

There is a growing need in the industry to lower prices of assembled semiconductor devices. These lower prices are best obtained by automating the assembly of the semiconductor devices.

Automation is enhanced by continuous and uninterrupted movement of the components that go into making the ultimate semiconductor device. But the components are very small and in most cases very fragile. Thus they are difficult to handle efficiently.

One solution to the handling problem is to affix the components to a constantly moving web of material. This web of material, generally called a carrier tape, is used to carry the components as they are formed into subassemblies. The tape performs the further function of providing parts such as leads to the devices.

CARRIER TAPE

The industry is now developing these carrier tapes to automate the assembly of the devices. These tapes are passed over a plate for carrying a multitude of semiconductor chips. The tape is also indexed a given distance at a time over various types of bonding machines. A chip is picked up from its supporting plate after it is bonded to the tape at each indexing cycle.

The chips are bonded to clusters leads. These leads are either fabricated out of the tape itself or they are fabricated out of material adhered to a tape substrate. The tape leads are called inner leads because each lead is later bonded to an outer lead. The outer leads are then inserted into the board of a circuit pack.

The lead clusters are incrementally spaced in the tape to coincide with each space in the indexing cycle as the tape progresses. After the chip is bonded to the cluster of inner leads, it is carried by the tape for further device assembly steps.

TAPE DEVELOPMENT

All carrier tapes include conductive material such as copper sheet out of which the leads are formed. Preferably the copper sheet is very thin to provide good bonding. Also very thin leads help to tolerate certain thermal cycling tests which must be endured by various types of assembled devices.

The copper sheet, called foil, is typically 0.7 to 2.8 mils in thickness. The foil weighs approximately $\frac{3}{4}$ to $2\frac{1}{2}$ ounces per square foot. Preferably the material is annealed copper of "dead soft" ductility. Such foil is very delicate and requires careful handling.

A prior art way to overcome the handling problem is to use a laminated web for the tape. The main part of the web consists of a film pf polyimide plastic used as a tape substrate. A strip of conductive foil is then adhered to the entire surface of the polyimide film or to the center alone for supplying the leads for such device. Metal deposition techniques are also used to provide the strip of metal conductor.

Some manufacturers are now developing methods of using the conductive foil along, without the polyimide substrate. Such methods must avoid warping the foil while it is being wound upon reels and while it is being indexed for device assembly. The accuracy of lead fabrication must be maintained. And the leads of each lead cluster must be bonded to the chip without distorting adjacent lead clusters on the foil tape.

BONDING

The inner leads are fabricated within the foil of the carrier tape in a cluster. These leads look like fingers which project toward the center of the cluster. The ends of the leads which project toward the center are free and the opposite ends are affixed to the tape.

The free ends of the leads are simultaneously bonded to pads on the chip by thermocompression methods. Each lead is precisely registered with its bonding pad on the chip. The pad is actually a thickened terminal which is part of the electronic circuit on the chip.

All free ends of the leads in the cluster are bonded at once to the chip. This takes place with one stroke of the bonding tool in a method often called "gang bonding."

OUTER LEAD BONDING

The inner leads are too fragile for end use so they must be bonded to stiff outer leads. Such outer leads are then connected to the outside world.

The stiff outer leads are formed in a strip of metal in clusters much like the clusters of the inner leads. However, there is a much larger hole in the center of the outer lead cluster and the strip is of thicker metal. This strip is called a lead frame by those skilled in the art. Once the outer lead bonding takes place, the lead frame will carry the device for future assembly.

The outer lead bonding is achieved by machine coordinated movement of the lead frame strip, the carrier tape, and the bonding tool. The carrier tape is indexed under the lead frame strip and over the cluster punching tool.

The punching tool drives upward stressing the leads and shearing the inner lead cluster at the perimeter of the cluster where each lead is affixed to the tape. The tool carries the chip and the sheared inner lead cluster upward and out of the carrier tape. The chip is carried into the hole in the outer lead cluster and the sheared end of each tiny inner lead and each outer lead is then precisely registered one with the other. And the chip has a defined posture in the device after bonding.

Each inner lead is simultaneously bonded to its proper outer lead thus transferring the device to the outer lead frame. And the carrier tape becomes a skeleton which is then scrapped.

INNER LEAD DEFORMATION "BUGGING"

At inner lead bonding, another important step takes place in the assembly. The bonding tool uniformly deforms the soft inner leads out of the plane of the carrier strip. Such deformation takes place when the chip is bonded to the cluster of inner leads and the chip is pulled off its supporting fixture where it was adhesively mounted. The step of uniformly deforming the inner leads is called "bugging" by those skilled in the art. The term "bugging" reflects the appearance of the chip and the inner lead cluster after inner lead bonding is done properly.

If the bugging is not done properly, further assembly of the device is impaired and certain thermal cycling qualities of the device can be adversely affected. When the "bug" is made the leads are stressed and deformed so that each lead becomes a part of a 4-cornered, bell-like configuration. The fixed end of each lead remains attached to the tape and the free end of each lead is bonded to the chip. The chip rides on the top of the bell in a horizontal position precisely in the center of the lead cluster. The chip is oriented so that the edges of the chip are very closely parallel to the sides of the tape.

Proper bugging is made easier by proper layout of the lead pattern. Ideally leads should be symmetrical about any axis drawn through the center of the lead pattern. Otherwise there will be uneven development of stresses in the leads and control of the stresses will be difficult to maintain.

EFFECTS OF IMPROPER STRESS CONTROL IN THE LEADS

If the stresses in the inner lead cluster are not controlled during bugging, the carrier tape itself can be affected. The stresses can be transmitted to and warp the structural margins of the tape. These margins have sprocket holes used for indexing. And the holes are used to precisely advance the carrier tape during assembly. If the stresses warp the tape, the sprocket holes will be enlarged, thus the registration of inner leads to outer leads at the outer lead bonding will be affected.

Stresses along the centerline of the tape can warp the tape and distort the adjacent inner lead clusters on the tape. Such distortion can effect the lead-to-pad registration at chip bonding and tilt the chip on the bug. Tilting of the chip risks short circuiting between the inner leads and the edges of the chip after further assembly steps.

If the lead shift off the chip pads by just 2 mils, assembly is impaired. The actual bonding area common to the pad and its mating lead is greatly reduced. And bonds made under these circumstances are weakened substantially. Also if leads are shifted 2 mils or more, short circuiting can develop. And certain parameters such as parasitic capacitance can become a factor in reducing circuit performance.

Controlling the lead deformation improves the posture of the chip after bonding. Good posture of the chip requires that the chip not be tilted and not be off center in the lead cluster. Good chip posture assures accurate registration at outer lead bonding. Adjustments in registration by a bonding operator are eliminated. Bonding is speeded and yields are improved.

Heretofore, control of the stresses in the deformation or bugging step has been difficult and uncertain.

SUMMARY OF THE INVENTION

Accordingly, it is an object of this invention to provide carrier tapes for semiconductor devices and improved methods of assembling electronic devices using the tape.

With this object and other objects in view, the present invention contemplates a continuous web of material which at least includes an electrical conductor strip. At least one pattern is in the web and at least one cluster of finger-like leads is in the pattern within the conductor strip. The leads have free ends which project toward the center of the cluster and opposite ends fixed to the web.

At least one stress relief site is in each of the leads located symmetrically about the longitudinal center line of each lead.

A method uses the tape to assemble semiconductor devices. A chip is bonded to the free ends of the leads in the cluster while opposite ends remain fixed to the tape. The leads are stressed to form a desired shape in the lead cluster. and the forming stresses in the leads are relieved at a stress relief site in each of the leads.

Each lead forms a part of a bell-like shape with the fixed end of each lead remaining attached to the tape. The free end of each lead is bonded to pads on a chip on top of bell. The chip rides in a true horizontal position, precisely in the center of the lead cluster. And the chip is angularly oriented so that the edges of the chip are parallel to the edges of the tape.

The stresses developed in forming the bell-like shape in the leads are uniformly relieved at stress-relief sites in the leads. Shaping is enhanced and the tape with its adjacent lead clusters is undamaged. So more chips are reliably bonded to the carrier tape. And precise registration of leads occurs when the shaped leads are bonded to stiff leads for end use.

BRIEF DESCRIPTION OF THE DRAWING

The foregoing and other objects of the invention may be better understood from the following detailed description thereof, when read in conjunction with the accompanying drawing wherein.

DETAILED DESCRIPTION

Figure 1A:
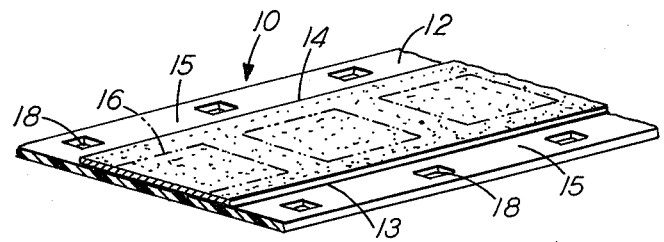
FIG. 1A is an isometric view of a prior art tape showing a web substrate and a conductor strip thereon.

Referring to FIG. 1A, a prior art tape 10 is shown isometrically. In this tape 10, a plastic film is employed to form a web substrate 12. This plastic film has suitable dimensional stability to withstand tensile stresses when it is mechanically indexed. The film also withstands short term exposure to heat stresses in bonding leads to chip pads.

One material known to withstand these stresses is polyimide. This is a thermosetting plastic supplied by E. I. Dupont de Nemours & Co., Inc., under the trademarks "H-film" and "Kapton." Polyimide has the disadvantages of not being reusable and of being very expensive. Polyester film such as that sold under the trademark "Mylar" by Dupont are also usable, although with less satisfactory results. Typically, the film substrates are generally 35 m.m. in width, although, 8,16 and 70 m.m. sizes are also available. Thicknesses are 0.5, 1, 2, 3, and 5 mils.

Copper is generally used for conductor strip 14. It can be easily affixed by adhesive 13 to the film 12. The copper can also be applied by electrodeposition upon the substrate or the plastic can be thermally cast in combination with the copper strip. And the strip of copper has good electrical conductivity required by the leads which it donates to the chip assembly.

Sprocket holes 18 are etched or cut out of the margins 15 so sprocket teeth can precisely index the tape. The pitch of the holes 18 center-to-center coincides with the pitch of the inner lead clusters 16. These clusters are formed out of the copper conductor using photo-etching methods.

Figure 1B:
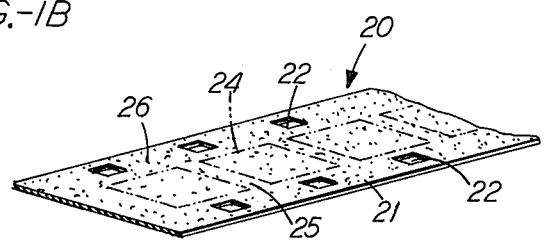
FIG. 1B is an isometric view of a tape formed entirely of conductor strip.

FIG. 1B shows a conductive tape 20 without a carrier substrate in accordance with the present invention. Copper foil 21 is used as the conductor strip and typically has a thickness ranging from 0.7 to 2.8 mils. The weight typically ranges from ½ to 2½ ounces per square foot. The material is provided under the Copper Development Association designation "CDA-102 OFHC" annealed "dead soft copper," plated with at least 30 microinches of gold in the lead area after the leads are formed.

The tape 20 has a pitch between lead clusters 24 of about 0.1875 inches. This pitch yields 64 clusters per linear foot of tape. The distance across medial plane 25 between lead clusters 24 can be as little as 26 to 30 mils according to this invention. This distance compares with 125 to 375 mils for most prior art tapes. Tape 20, therefore, provides significantly more leads at significantly less metal cost than other prior art tapes.

For more intensive use, the tape 20 can be wider and have at least three rows of clusters 24, lengthwise of the tape. And these three rows produce 192 clusters per linear foot of tape.

Rolled-annealed copper foil of "dead soft" ductility is used for inner leads for many reasons. When the leads are bonded to pads on a chip, microfractures are reduced. Such reduction is also evident when the soft leads are formed into the desired shape for outer lead bonding. Lead plating is enhanced by using foil without a substrate, and pattern generation on the copper foil is superior because etching lines are cleaner. In particular any preferential etching along grain boundaries is minimized.

Holes 22 are provided in the structural margin 26 of strip 21. These holes 22 are provided for sprocket teeth used to index the tape 20. Such holes 22 are formed in the same patterns with the lead clusters 24. And the patterns can be formed, developed, and etched into the tape without laminating or electrodepositing steps used in the prior art.

Figure 2:
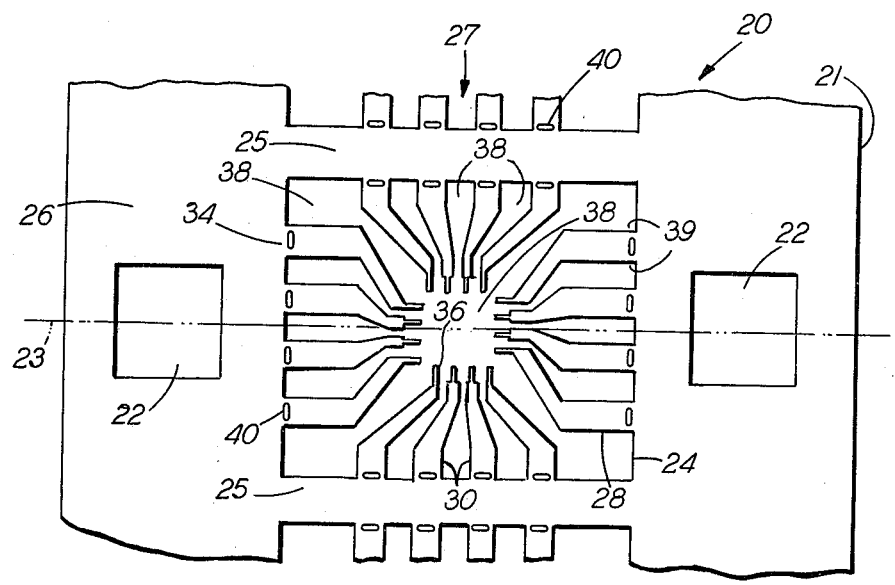
FIG. 2 is a plan view of a pattern in a tape in accordance with the present invention.

FIG. 2 shows a pattern 27 in a foil tape in accordance with the present invention. The pattern 27 provides a structural margin 26 interrupted by sprocket holes 22. The tape 20 is preferably about 11 m.m. wide, although it could be at least 35 m.m. wide to accommodate more rows of clusters 24 or a larger version of cluster 24.

The cluster 24 is shown having 16 finger-like leads 28 and 30. Free ends 36 project toward the center and opposite ends 34 are fixed to margins 25 or medial planes 26. The cluster 24 can be made larger or smaller to suit requirements for more or less leads or of leads having different widths.

In the embodiment shown in FIG. 2, the leads are nearly symmetrical about the center of the cluster 24. An important advantage is gained by having pattern 27 laid out as nearly symmetrical about its centerline 23 as is convenient. When the chip (not shown) is bonded to the free ends 36 of leads 28 and 30, such leads will be deformed into a desired shape as hereinafter described. And such deformation is more uniformly made when the pattern 27 is symmetrical about centerline 23.

In pattern 27 there are long leads 28 and short leads 30 disposed about a square, central opening or hole 38. Other openings 38—38 of various configurations isolate the leads 28 and 30 for bonding to a chip (not shown).

It is important in pattern 27 that the leads 28 and 30 are formed with clean edges and precise line definition. It is also important that the lead outlines are accurately placed within the pattern typically within ±0.1 mil. of desired placement. Such line definition and placement accuracy are required for precise lead registration to pads or outer leads for successful bonding; it is also important for avoiding short circuiting across terminal pads on chips.

In the preferred embodiment the pattern 27 is laid out so that sprocket holes 22 are precisely symmetrical about centerline 23 drawn through lead clusters 24. Such precision assures careful registration of the leads at chip bonding and at outer leading bonding because each position of the sprocket teeth is coordinated with the bonding tool.

Also in FIG. 2 medial planes 25 are shown separating clusters 24 by a distance of 26 to 30 mils. Planes 25 span between structural margins 26 which resist the tensile forces applied to the foil 21 when the tape 20 is indexed for device assembly.

Stress relief sites 39 are shown at the fixed ends 34 of all leads 28 and 30. Sites 39 are located symmetrically about the centerlines of leads 28 and 30. Sites 39 are an important element in lead deformation hereinafter described.

Figure 3:
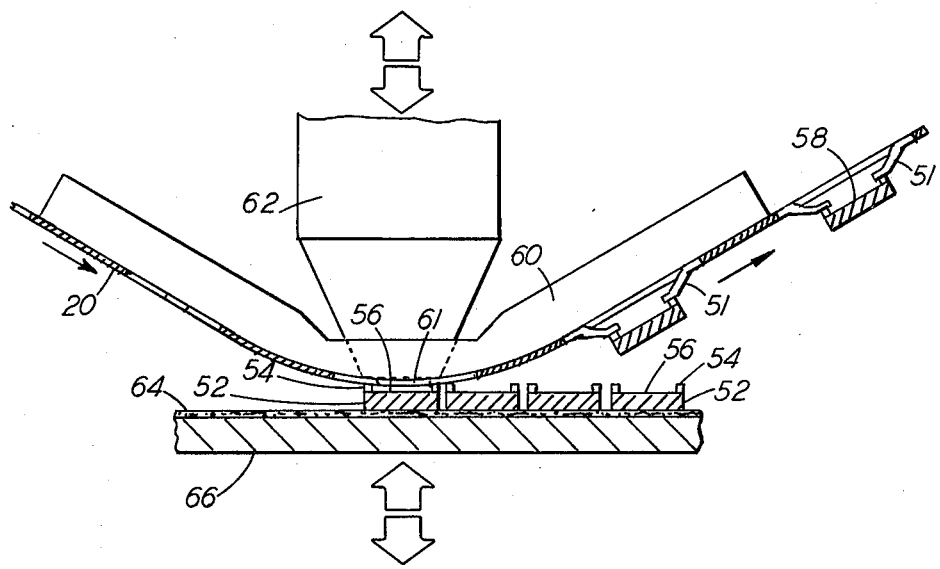
FIG. 3 is a cross section of a view of an inner lead bonding operation showing a reciprocating bonding thermode, a tape guide, tape, chips, and a chip support fixture.

FIG. 3 is a cross sectional view of an inner lead bonding operation. This operation can be performed on machines which are commercially available. For explanatory purposes, the operation will be described herein with reference to a multiple-lead bonder manufactured by The Jade Corporation, 3063 Philmont Avenue, Huntington Valley, PA.

Foil tape 20 is indexed within guide 60 until an inner lead cluster is centered over the active face 56 of chip 52. The free ends of the inner leads are precisely registered over the chip bonding pads 54.

Chips 52 are mounted upon a fixture 66, called a carrier. The chips 52 are affixed to the carrier by adhesive 64.

The bonding tool 62 is precisely disposed about the center of chip 52 and the lead cluster. The tool 62 moves downward through an opening 61 in guide 60 and compresses the free ends of the leads upon chip pads 56.

Bonding tool 62 also serves as a heating element for bonding, called a thermode. When tool 62 compresses the leads upon pads 54 it heats the leads, the pads 54 and adhesive 64. And adhesive 64 beings to liquefy.

When the leads are completely bonded to pads 54, the tool 62 withdraws vertically upward and chip support fixture 66 withdraws vertically downward. But adhesive 64 still retains chip 52 sufficiently so the leads deform into a bell-like shape 51, called a "bug." The tape 20 then indexes to the right with the chip 52 and bugged lead cluster 51 attached thereto.

Figure 4:
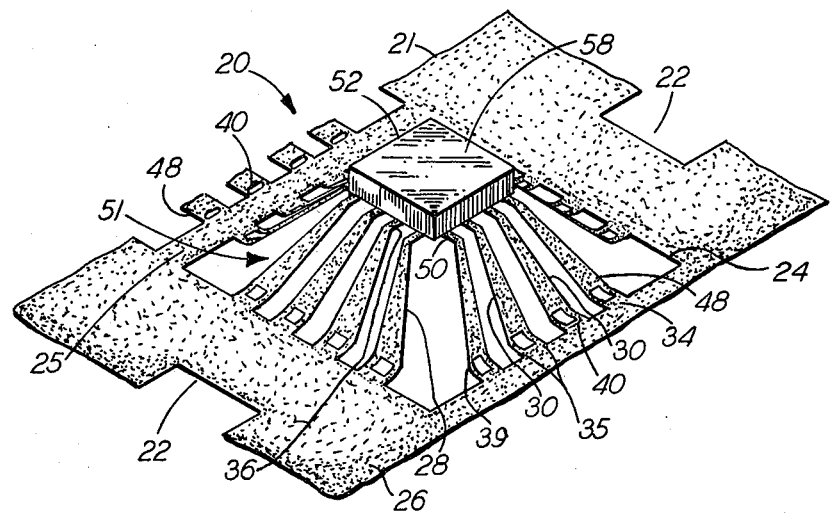
FIG. 4 is an isometric view of an inner lead cluster and chips after the free ends of the leads are bonded to the chip, the leads are "bugged" and the tape is inverted for outer lead bonding.

FIG. 4 shows a completed assembly of inner lead cluster 24 to chip 52. Chip 52 is bonded to the free ends 36 of the leads 28 and 30. Opposite fixed ends 34 remain fixed to the tape. The leads 28 and 30 are stressed uniformly to form the desired shape in the lead cluster 24.

Each lead 28 or 30 forms a part of a four-cornered bell-like shape 51. The chip 52 rides in a horizontal position, precisely in the center of the lead cluster 24. And the chip 52 is angularly oriented so that the edges of the chip 52 are parallel to the edges of the tape 20. Several features of the bell-like shape or bug 51 are important to assembly of the device and to device performance. First the bug 51 may not be twisted about a horizontal plane or the angular orientation of chip 52 will be affected. Depending upon the number of leads in cluster 24 such twisting causes a high risk of short circuits across the leads.

Secondly the top part of the bug 51 may not be shifted or the chip 52 will be off center of the cluster 24. And such shifting affects later encapsulation steps of device assembly. Equally important each end of the leads 28 and 30 must be nearly tangential to a horizontal plane. Bonding to chip pads 54 is thus enhanced and later bonding to outer leads is improved. Also final shaping of the bug at outer lead bonding is made easier.

When the leads 28 and 30 are flexed and stretched to form the bug 51, flexural and tensile stresses develop in the leads. Furthermore, the heat of chip bonding travels along the leads developing thermal stresses.

Provision must be made in the lead pattern to control these stresses. Otherwise the stresses would be transmitted into the structural margins 26 and medial planes 25. In structural margins 26 the stresses warp the foil 21 and enlarge the sprocket holes 22. In the medial planes 25 to which leads are attached, the stresses distort the planes and thus destroy lead placement within the adjacent clusters.

To control the stresses, sites 39 are formed into the leads 28 and 30 preferably at fixed ends 34.

Figure 5A:
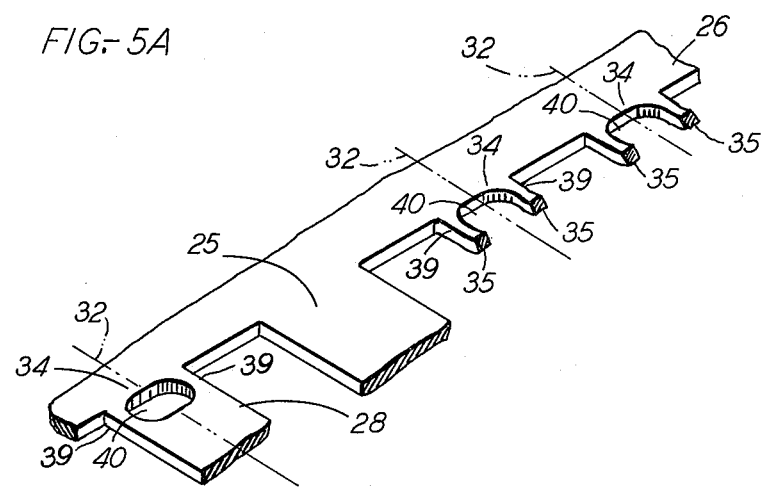
FIG. 5A is an isometric view showing a portion of tape with leads, each having a perforated stress-relief site, in accordance with one embodiment of the present invention and stress-relief sites after the leads are stressed and sheared away from the tape.
Figure 5B:
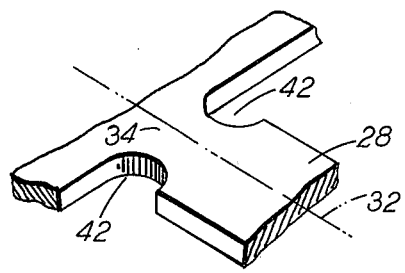
FIG. 5B is an isometric view of a lead having edge cutouts for a stress-relief site in accordance with an embodiment of the present invention.
Figure 5C:
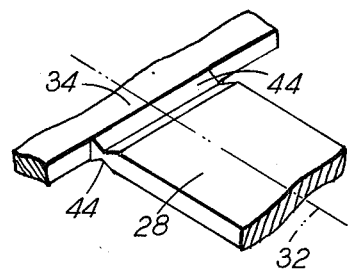
FIG. 5C is an isometric view of a lead having a grooved stress-relief site in accordance with an embodiment of the present invention.

In FIGS. 5A, 5B, and 5C the sites 39 are formed by reducing the cross sectional area of the lead. Such reduction weakens the lead at the site. Stresses concentrate at the weakened site deforming the metal and preventing transmittal of stresses into the margins.

Sites 39 are formed in one embodiment by a slot etched within the edges of the leads 28 and 30. As shown in FIGS. 4 and 5A, the slot has rounded corners which prevent all stresses from developing at one point thereby pulling the lead unevenly. Sites 39 are formed symmetrically about the longitudinal centerline 32 of each lead. Strain elements 35 are of equal strength. These elements function very much like a fuse in an electrical circuit. Elements 35 stretch and tear, if necessary, to protect margins 26, sprocket holes, lead attach planes 25 and adjacent lead clusters.

Strain elements 35 in sites 39 are of equal strength in all leads 28 and 30 of the cluster 24. Generally sites 39 are all located at fixed ends 34 of leads 28 and 30. Of course, such sites can be located elsewhere if required for better shaping of bug 51. And more than one site can be located in each lead if sharp, angular deformations in each lead are desired.

FIG. 5A shows in more detail sites 39 before and after sites have been stressed. A slot 40 is shown in one lead before deformation with elements 35 intact. On the other side of lead attach plane 25 two sites 39 are shown after rupture. Slots 40 are deformed. Elements 35 are stretched slightly inward and upward of the cluster plane.

FIGS. 5B and 5C show alternate sites 39 which are formed by reducing the cross section of leads 28 and 30. FIG. 5B shows cut outs 42 made on either edge of the lead. Cut outs 42 are symmetrically located about the longitudinal centerline 32 of the lead so the lead will stretch uniformly without twisting.

FIG. 5C shows grooves cut out of the cross section of the lead at site 39. A groove is shown cut out of the top of the lead and one is cut out of the underside of the lead. But only one groove is necessary providing the strength of the site is sufficiently reduced to avoid stress transmittal into the tape margins. By cutting the groove completely across the lead, the stress characteristics of site 39 are made symmetrical about the lead centerline 32.

Figure 5D:
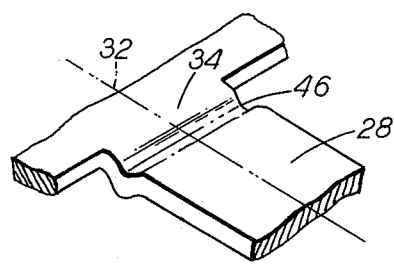
FIG. 5D is an isometric view of a lead having a uniform deformed stress relief site.

FIG. 5D shows a mwethod of forming a stress-relief site 39 without reducing cross sectional area of the leads. A uniform deformation 46 is made completely across the lead. Because the stress path is diverted about the deformation, stresses will concentrate at the site. And because the deformation is symmetrical about the longitudinal centerline 32 of the lead, such stresses will concentrate uniformly at the site.

Figure 5E:
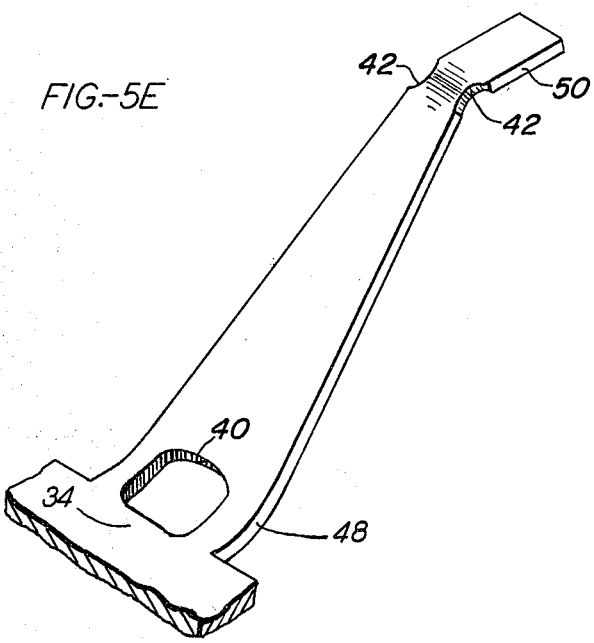
FIG. 5E is an isometric view of a lead having a stress-relief site at the fixed end of a lead and another stress-relief site elsewhere in the lead.

FIG. 5E is an isometric view of a lead having a stress-relief site at the fixed end of a lead and another stress-relief site elsewhere in the lead.

Figure 6:
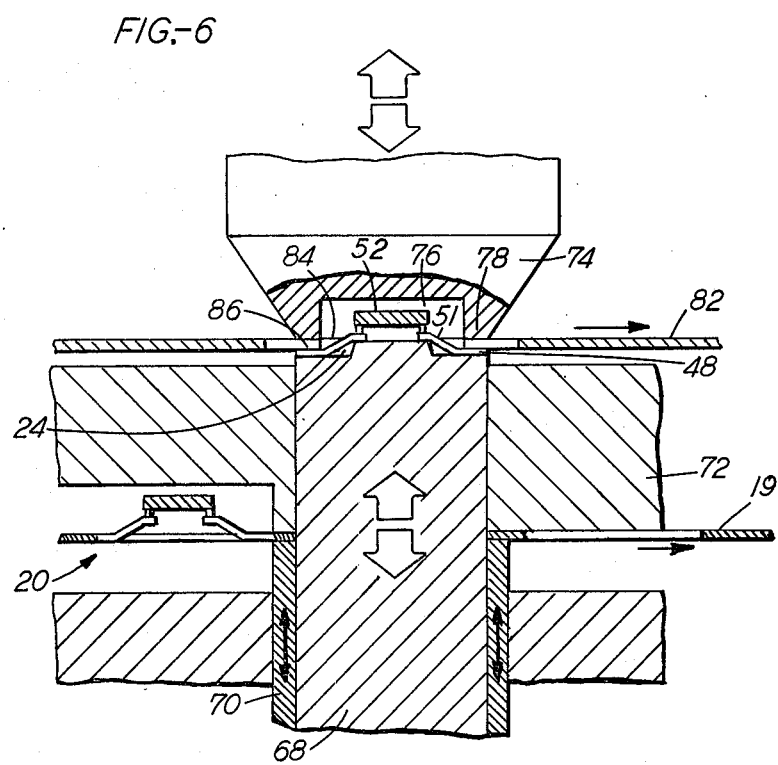
FIG. 6 is a cross sectional view of an outer lead bonding operation showing a reciprocated punch and compression tool, a die, a thermode anvil with cavity, a tape, an outer lead frame strip, and chips bonded thereto.

The utility of properly formed bug 51 in outer lead bonding can be seen by reference to FIG. 6. Tape 20, with chip 52 riding on top of bug 51, is indexed into position for outer lead bonding. Tape 20 passes over punch compression tool 68 until the bugged lead cluster 51 with chip 52 is precisely centered over tool 68 and under thermode-anvil 74. Tool 68 is contoured to fit the shape of bug 51. Outer lead frame strip 82 passes over die 72 until its outer lead cluster (not fully shown) is centered under cavity 76 of thermode 74.

When the carrier tape 20 and lead frame 82 are properly indexed, punch 68 drives upward guided by pressure pad 70. Pad 70 presses tape 20 against die 72 and punch 68 shears the ends 34 of inner lead cluster 24 from tape 20. Punch 68 continues upward, driving all ends 34 of inner lead cluster 24 against outer lead ends 86. And the combined ends 34 and 86 are compressed against thermode bonding frame 78.

All elements are thus in position for outer lead bonding as shown in FIG. 6. This operation can be performed on machines which are commercially available. For explanatory purposes the operation will be described with reference to a multiple-lead bonder manufactured by The Jade Corporation, 3063 Philmont Avenue, Huntington Valley, Pa.

The bug 51 of inner lead cluster 24 fits through hole 84 of outer lead frame 82. The chip rides horizontal on the bug within thermode cavity 76. Advantageously, all lead ends 34 and 84 are in precise registration. The heat and compression from thermode 74 and punch 68 bonds all leads at once.

When punch 68 is retracted the chip 52 and bugged lead cluster 51 are transferred to lead frame 82. Lead frame strip moves to the right for further assembly steps. Depleted carrier tape 20 becomes a skeleton tape 19; it moves to the right and is salvaged for scrap.

From the foregoing description, it is apparent that significant advantages result from using tape 20 of the present invention. Among others, these advantages include a high density of lead clusters per linear foot of tape. Costly substrate webs 12 made of plastic in the prior art are eliminated. More precise registration of leads 28 and 30 to chip pads 54 is attained. Equally precise registration of leads 28 and 30 to outer leads 86 is gained at outer lead bonding. And there is a reduced likelihood of short circuiting in the assembled device. Such reduction occurs between leads 28 and 30 in the bug 51 between leads 28 and 30 and the chip pads 54 and between leads 28 and 30 and the edges of chip 52. Finally thermal cycling tests indicate that chip and lead bonding is improved.

Practical embodiments of the invention and various applications thereof have been illustrated herein. Nevertheless, it is to be understood that various modifications may be used which deviate from these disclosed embodiments. And such modifications may be used without departing from the spirit and scope of the present invention.

What is claimed is:

1. A tape which comprises:
   a continuous web having at least an electrical conductor strip;
   at least one pattern in the continuous web;
   at least one cluster of finger-like leads in the pattern which leads have free ends that project toward the center of the cluster and opposite ends fixed to the web; and
   at least one stress-relief means at a stress-relief site in each of the leads formed by reducing the cross sectional area of the lead to weaken the cross section and located symmetrically about the longitudinal centerline of each lead for absorbing flexure and tensile stresses by concentrating the stresses to plastically deform the leads at the stress-relief sites to form the finger-like leads into a spaced relationship with the plane of the tape during an inner lead bonding operation.

2. A tape as defined in claim 1, wherein at last one perforation is made in the cross section of each lead within the edges of the lead to reduce its cross sectional area.

3. A tape as defined in claim 2, wherein the perforation is a slot located within the edge of the lead with each portion of lead remaining between the slot and the edge of the lead being of equal resistance to stress and the four corners of the slot being rounded to avoid concentration of stresses at the corners.

4. A tape as defined in claim 1, wherein lead area is removed from the edges of each lead at the cross section to reduce its cross sectional area.

5. A tape as defined in claim 1, wherein one or more grooves are cut across the stress relief site of each lead to reduce its cross sectional area.

6. A tape as defined in claims 1, 2, 3, 4 and 5 wherein the reduction made in the cross sectional area of leads at the stress relief site provides resistance to stresses which is uniform among the leads in the cluster.

7. A tape as defined in claim 1, wherein a stress relief site is at the fixed end of each lead and at least one more stress relief site is located elsewhere in each lead.

8. A tape as defined in claim 1, which includes a series of patterns incrementally spaced lengthwise in the continuous web and each pattern includes a cluster of leads in aligned relation with one or more holes to accommodate wheel sprockets adjacent the margin of the tape.

9. A metal foil carrier tape, comprising:
   a continuous web of copper foil ranging from about 0.7 mil to about 2.8 mil in thickness and of a width suitable for forming a desired pattern in the tape;
   a plurality of patterns in the web, incrementally spaced in one or more rows lengthwise of the web;
   a cluster of finger-like leads in each pattern and aligned relation with one or more holes along the edges of the web to accommodate wheel sprockets, said leads having free ends projecting toward the center of the cluster and opposite ends affixed to the web; and
   a stress-relief site at the fixed end of each lead formed by a slot with rounded corners to reduce the cross sectional area of the lead by an amount equal to the cross sectional area of the slot leaving uniform cross sectional area remaining at each of said stress-relief sites in each lead to uniformly relieve stresses in the leads and in the web to which they are attached when the leads are simultaneously stressed by concentrating the stresses to plastically deform the leads at the stress-relief sites to form the finger-like leads into a spaced relationship with the plane of the tape.

* * * * *